(12) United States Patent
Yamaguchi et al.

(10) Patent No.: US 12,557,578 B2
(45) Date of Patent: Feb. 17, 2026

(54) SUBSTRATE PROCESSING METHOD AND SUBLIMATION DRYING PROCESSING AGENT

(71) Applicant: SCREEN HOLDINGS CO., LTD., Kyoto (JP)

(72) Inventors: Yu Yamaguchi, Kyoto (JP); Masaki Inaba, Kyoto (JP); Masayuki Otsuji, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 1 day.

(21) Appl. No.: 18/565,380

(22) PCT Filed: Mar. 31, 2022

(86) PCT No.: PCT/JP2022/016677
§ 371 (c)(1),
(2) Date: Nov. 29, 2023

(87) PCT Pub. No.: WO2022/254951
PCT Pub. Date: Dec. 8, 2022

(65) Prior Publication Data
US 2024/0290608 A1     Aug. 29, 2024

(30) Foreign Application Priority Data

Jun. 4, 2021  (JP) .................. 2021-094068

(51) Int. Cl.
*H01L 21/02*      (2006.01)
(52) U.S. Cl.
CPC ............................ *H01L 21/02054* (2013.01)

(58) Field of Classification Search
CPC ......... H01L 21/02054; H01L 21/02057; H01L 21/67167; H01L 21/67178
See application file for complete search history.

(56) References Cited

U.S. PATENT DOCUMENTS

2019/0189427 A1*  6/2019  Thorum ............... B81C 1/00825
2020/0411307 A1*  12/2020  Sasaki ................... C11D 7/3209

FOREIGN PATENT DOCUMENTS

JP         2012-243869 A      12/2012
JP         2020010015 A  *    1/2020   ....... H01L 21/02057
                    (Continued)

OTHER PUBLICATIONS

JP2020-010015A machine translation (Year: 2020).*
International Search Report mailed Jul. 5, 2022 in corresponding PCT International Application No. PCT/JP2022/016677.

*Primary Examiner* — Douglas Lee
(74) *Attorney, Agent, or Firm* — OSTROLENK FABER LLP

(57) ABSTRACT

The present invention includes a liquid film formation step of supplying a processing liquid in which a sublimation drying processing agent obtained by mixing a first sublimable substance and a second sublimable substance which are different from each other in a eutectic composition or a near-eutectic composition is liquefied, onto a front surface of a substrate on which a pattern is formed, to thereby form a liquid film of the processing liquid on the front surface of the substrate, a solidified film formation step of solidifying the liquid film of the processing liquid, to thereby form a solidified film of the sublimation drying processing agent, and a sublimation step of sublimating the solidified film, to thereby remove the solidified film from the front surface of the substrate.

2 Claims, 6 Drawing Sheets

(56) References Cited

FOREIGN PATENT DOCUMENTS

| | | |
|---|---|---|
| JP | 2021-010002 A | 1/2021 |
| KR | 10-2021-0001994 A | 1/2021 |
| KR | 10-2021-0014145 A | 2/2021 |

\* cited by examiner

F I G. 3
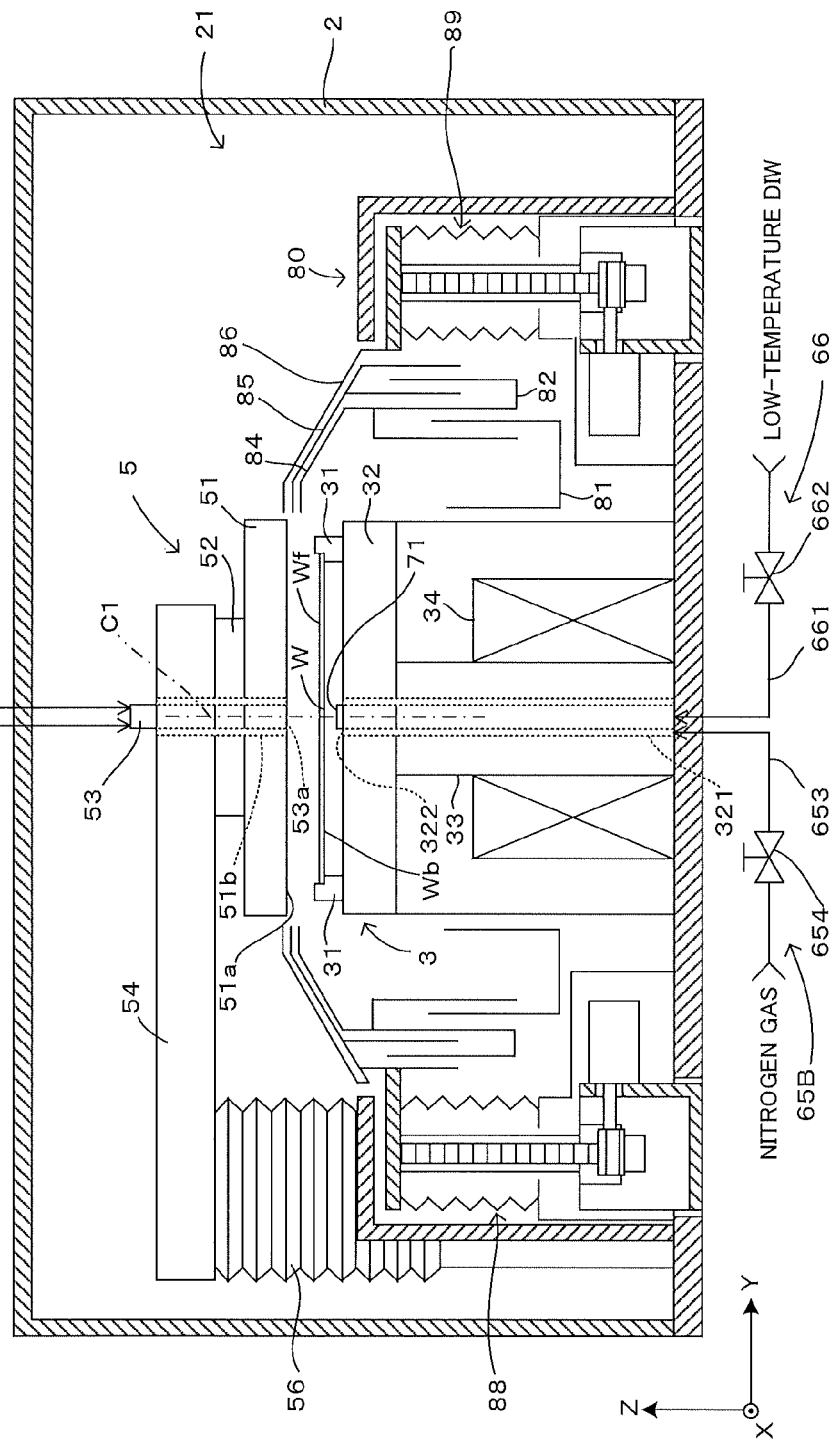

F I G. 7
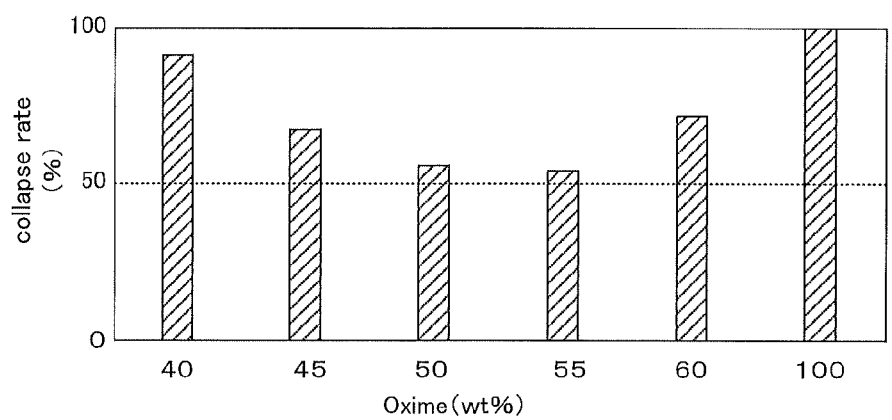

SUBSTRATE PROCESSING METHOD AND SUBLIMATION DRYING PROCESSING AGENT

CROSS REFERENCE TO RELATED APPLICATION

The present application is a 35 U.S.C. §§ 371 national stage application of International Application No. PCT/JP2022/016677, filed Mar. 31, 2022, which claims priority to Japanese Patent Application No. 2021-094068, filed Jun. 4, 2021, the contents of which are incorporated herein by reference.

TECHNICAL FIELD

The present invention relates to a substrate processing method using a sublimation drying processing agent containing a sublimable substance in which phase transition occurs from a solid state to a gaseous state without passing through a liquid state, to thereby dry substrates each having a front surface on which a pattern is formed, and to a sublimation drying processing agent used for the substrate processing method. The substrates include semiconductor wafers, liquid crystal display substrates, substrates for FPD (Flat Panel Display) such as organic EL (electroluminescence) display device, optical disk substrates, magnetic disk substrates, magneto-optical disk substrates, photomask substrates, ceramic substrates, solar cell substrates and the like.

The disclosure of Japanese Patent Applications enumerated below including specifications, drawings and claims is incorporated herein by reference in its entirety:
No. 2021-094068 filed on Jun. 4, 2021.

BACKGROUND

A manufacturing process of an electronic component such as a semiconductor device or a liquid crystal display device includes a step of forming a pattern by repeating a process of forming a film or etching on a front surface of a substrate. Further, after this pattern is formed, a cleaning process by a chemical, a rinsing process by a rinse liquid, a drying process and the like are performed in this order. With the miniaturization of patterns, the importance of the drying process has particularly increased. That is, a technique for suppressing or preventing the occurrence of pattern collapse has become important in the drying process. Accordingly, a substrate processing method has been proposed which dries a substrate by sublimation using a processing liquid in which camphor is dissolved in IPA (isopropyl alcohol), for example, as described in Patent Literature 1.

CITATION LIST

Patent Literature (Patent Literature 1) Japanese Patent Application Laid Open Gazette No. 2012-243869

SUMMARY

Technical Problem

In the above-described background art, a processing liquid in which a sublimable substance (camphor) is dissolved in a solvent (IPA) is used as a sublimation drying processing agent. Though the solvent is then evaporated in order to deposit the sublimable substance on a front surface of a substrate (solidified film formation step), part of the solvent sometimes remains in a solidified film formed on the front surface of the substrate. As a result, in some cases, collapse of a pattern is caused by the remaining solvent.

The present invention is intended to solve the above problem, and it is an object of the present invention to provide a substrate processing method which makes it possible to satisfactorily dry a substrate with excellent drying performance while preventing collapse of a pattern, and a sublimation drying processing agent suitable for the substrate processing method.

Solution to Problem

One aspect of this invention is directed to a substrate processing method. The method comprises: a liquid film formation step of supplying a processing liquid in which a sublimation drying processing agent is liquefied, onto a front surface of a substrate on which a pattern is formed, to thereby form a liquid film of the processing liquid on the front surface of the substrate, the sublimation drying processing agent being a mixture of a first sublimable substance and a second sublimable substance which differ from each other in a eutectic composition or a near-eutectic composition; a solidified film formation step of solidifying the liquid film of the processing liquid, to thereby form a solidified film of the sublimation drying processing agent; and a sublimation step of sublimating the solidified film, to thereby remove the solidified film from the front surface of the substrate.

Other aspect of the invention is a sublimation drying processing agent which is supplied in a liquid state onto a front surface of a substrate on which a pattern is formed, and then solidified and sublimated in this order, to be used for drying the front surface of the substrate. In the sublimation drying processing agent, a first sublimable substance and a second sublimable substance which differ from each other are mixed in a eutectic composition or a near-eutectic composition.

Advantageous Effects of Invention

The sublimation drying processing agent according to the present invention is obtained by mixing the first sublimable substance and the second sublimable substance which are different from each other in the eutectic composition or the near-eutectic composition. Therefore, solvent residue on the solidified film, which has been a problem with conventional technology using a sublimation drying processing agent in which the sublimable substance is dissolved in the solvent, does not occur. As a result, it is possible to suppress the collapse of a pattern on the front surface of the substrate.

Further, since the sublimation drying processing agent is used, in which two types of sublimable substances are mixed in the eutectic composition or the near-eutectic composition, the following action effect is also produced. For example, the sublimation drying processing agent may be formed of a single sublimable substance in order to prevent the solvent from remaining. When the liquid film is formed of a processing liquid in which the sublimable substance is liquefied, on the front surface of the substrate, and then solidified, however, a stress occurring in the growth of grain boundary becomes relatively large, as described later. In contrast to this, according to the present invention, in the solidification of the liquid film, a eutectic structure of the first sublimable substance and the second sublimable substance is formed. This eutectic structure is finer than a deposited structure of a single sublimable substance, and the stress occurring in the growth of the grain boundary is thereby suppressed. As a result, this greatly contributes to suppression of the collapse of the pattern. Moreover, in the sublimation drying processing agent according to the present invention, the melting point thereof becomes lower than that of the sublimation drying processing agent formed of a single sublimable substance and there is a merit of ensuring an increase in the workability and reduction in the energy cost. Further, the thickness controllability of the liquid film is increased due to a decrease in the melting point and a solidified film having a thickness corresponding to the pattern is formed, and it is thereby possible to further increase the suppression of the collapse of the pattern.

All of a plurality of constituent elements of each aspect of the invention described above are not essential and some of the plurality of constituent elements can be changed, deleted or replaced by new other constituent elements or limitation contents can be partially deleted as appropriate to solve some or all of the problems described above or achieve some or all of effects described in this specification.?? Further, some or all of technical features included in one aspect of the invention described above can be combined with some or all of technical features included in another aspect of the invention described above into one independent aspect of the invention to solve some or all of the problems described above or achieve some or all of effects described in this specification.

BRIEF DESCRIPTION OF DRAWINGS

FIG. 3 is a partial sectional view showing a configuration of a processing unit;

FIG. 7 is a graph showing a summary of verification results of the substrate processing method in accordance with the present invention.

DESCRIPTION OF EMBODIMENTS

The First Embodiment

<<Overall Configuration of Substrate Processing Apparatus>>

Figure 1:
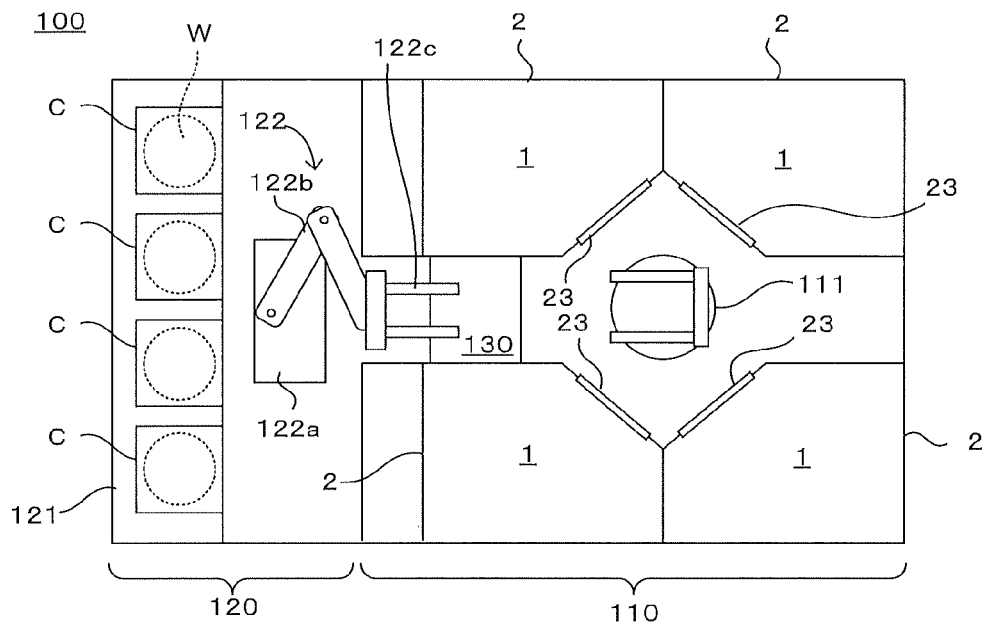
FIG. 1 is a plan view showing a schematic configuration of a substrate processing apparatus capable of performing a first embodiment of a substrate processing method in accordance with the present invention.
Figure 2:
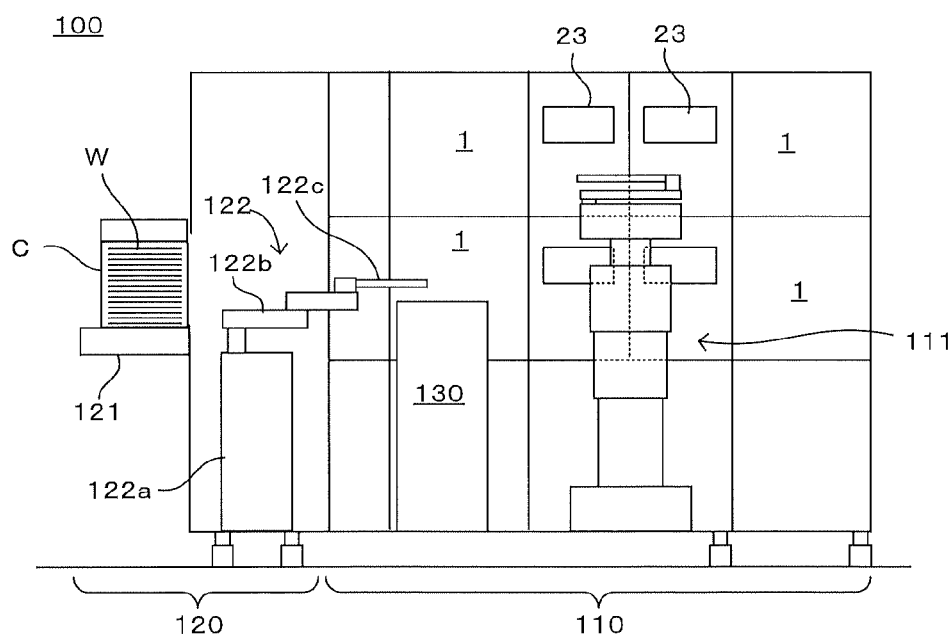
FIG. 2 is a side view of the substrate processing apparatus shown in FIG. 1.

FIG. 1 is a plan view showing a schematic configuration of a substrate processing apparatus capable of performing the first embodiment of a substrate processing method in accordance with the present invention. FIG. 2 is a side view of the substrate processing apparatus shown in FIG. 1. These figures are diagrams not showing the external appearance of the apparatus, but showing an internal structure of a substrate processing apparatus 100 by excluding an outer wall panel and other partial configurations. This substrate processing apparatus 100 is, for example, a single-wafer type apparatus installed in a clean room and configured to process substrates W each having a circuit pattern (hereinafter, referred to as a "pattern") only on one principal surface one by one. A first embodiment of a substrate processing method according to the present invention is carried out in the substrate processing apparatus 100. In this specification, a pattern formation surface (one principal surface) formed with the pattern is referred to as a "front surface Wf" and the other principal surface not formed with the pattern on an opposite side is referred to as a "back surface Wb". Further, a surface facing down is referred to as a "lower surface" and a surface facing up is referred to as an "upper surface". Further, in this specification, the "pattern formation surface" means a surface of the substrate where an uneven pattern is formed in an arbitrary region regardless of whether the surface is flat, curved or uneven.

Herein, various substrates such as semiconductor wafers, glass substrates for photomask, glass substrates for liquid crystal display, glass substrates for plasma display, substrates for FPD (Flat Panel Display), optical disk substrates, magnetic disk substrates and magneto-optical disk substrates can be applied as the "substrate" in this embodiment. Although the substrate processing apparatus used in processing semiconductor wafers is mainly described as an example with reference to the drawings below, application to the processing of various substrates illustrated above is also possible.

As shown in FIG. 1, the substrate processing apparatus 100 includes a substrate processing station 110 for processing the substrate W and an indexer station 120 coupled to this substrate processing station 110. The indexer station 120 includes a container holder 121 capable of holding a plurality of containers C for housing the substrates W (FOUPs (Front Opening Unified Pods), SMIF (Standard Mechanical Interface) pods, OCs (Open Cassettes) for housing a plurality of the substrates W in a sealed state), and an indexer robot 122 for taking out an unprocessed substrate W from the container C by accessing the container C held by the container holder 121 and housing a processed substrate W in the container C. A plurality of the substrates W are housed substantially in a horizontal posture in each container C.

The indexer robot 122 includes a base 122a fixed to an apparatus housing, an articulated arm 122b provided rotatably about a vertical axis with respect to the base 122a, and a hand 122c mounted on the tip of the articulated arm 122b. The hand 122c is structured such that the substrate W can be placed and held on the upper surface thereof. Such an indexer robot including the articulated arm and the hand for holding the substrate is not described in detail since being known.

The substrate processing station 110 includes a substrate conveyor robot 111 arranged substantially in a center in a plan view and a plurality of processing units 1 arranged to surround this substrate conveyor robot 11. Specifically, the plurality of (eight in this example) processing units 1 are arranged to face a space where the substrate conveyor robot 111 is arranged. The substrate conveyor robot 111 randomly accesses these processing units 1 and transfers the substrates W. On the other hand, each processing unit 1 performs a predetermined processing to the substrate W. In this embodiment, these processing units 1 have the same function. Thus, a plurality of the substrates W can be processed in parallel. Further, in the present embodiment, a passing part 130 is provided in order to smoothly pass the substrate W between the substrate processing station 110 and the indexer station 120.

<<Configuration of Processing Unit 1>>

Figure 4:
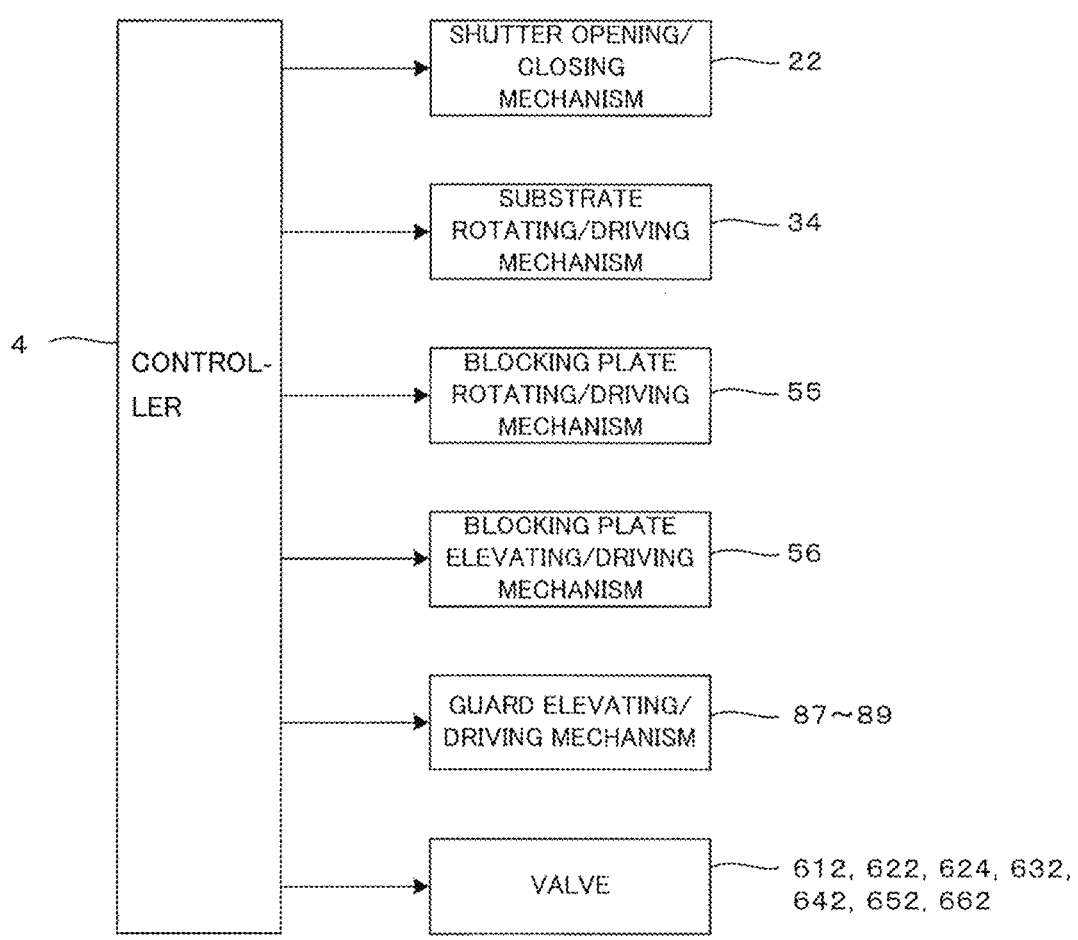
FIG. 4 is a block diagram showing an electrical configuration of a controller for controlling the processing unit.

FIG. 3 is a partial sectional view showing a configuration of the processing unit. FIG. 4 is a block diagram showing an electrical configuration of a controller for controlling the processing unit. Note that although a controller 4 is provided for each processing unit 1 in this embodiment, the plurality of processing units 1 may be controlled by one controller. Further, the processing units 1 may be controlled by a control unit (not shown) for controlling the entire substrate processing apparatus 100.

The processing unit 1 includes a chamber 2 having an internal space 21 and a spin chuck 3 housed in the internal space 21 of the chamber 2 to hold the substrate W. As shown in FIGS. 1 and 2, a shutter 23 is provided on a side surface of the chamber 2. A shutter opening/closing mechanism 22 (FIG. 4) is connected to the shutter 23, and the shutter 23 is opened/closed in response to an open/close command from the controller 4. More specifically, in the processing unit 1, the shutter opening/closing mechanism 22 opens the shutter 23 when an unprocessed substrate W is carried into the chamber 2, and the unprocessed substrate W is carried to the spin chuck 3 in a face-up state by the hand of the substrate conveyor robot 111. That is, the substrate W is placed on the spin chuck 3 with the front surface Wf faced up. If the hand of the substrate conveyor robot 111 is retracted from the chamber 2 after the substrate is carried in, the shutter opening/closing mechanism 22 closes the shutter 23. Then, a desired substrate processing is performed at a predetermined substrate processing temperature by supplying a chemical, DIW (deionized water), an IPA, a processing liquid and a nitrogen gas to the front surface Wf of the substrate W as described later in the internal space 21 of the chamber 2. Further, after the substrate processing is finished, the shutter opening/closing mechanism 22 opens the shutter 23 again and the hand of the substrate conveyor robot 111 carries out the processed substrate W from the spin chuck 3. As just described, in this embodiment, the internal space 21 of the chamber 2 functions as a processing space in which the substrate processing is performed while the substrate processing temperature environment is maintained. Further, in the present embodiment, as the "substrate processing temperature", the internal space 21 is maintained at a normal temperature (in a temperature range from 5° C. to 35° C.).

The spin chuck 3 includes a plurality of chuck pins 31 for holding the substrate W, a spin base 32 formed into a disk shape along a horizontal direction to support the plurality of chuck pins 31, a center shaft 33 provided rotatably about an axis of rotation C1 parallel to a surface normal extending from a center of the front surface of the substrate W while being coupled to the spin base 32, and a substrate rotating/driving mechanism 34 for rotating the center shaft 33 about the axis of rotation C1 by a motor. The plurality of chuck pins 31 are provided on a peripheral edge part of an upper surface of the spin base 32. In this embodiment, the chuck pins 31 are arranged at equal intervals in a circumferential direction. If the motor of the substrate rotating/driving mechanism 34 operates in response to a rotation command from the controller 4 with the substrate W placed on the spin chuck 3 held by the chuck pins 31, the substrate W rotates about the axis of rotation C1. Further, the chemical, the IPA, the DIW, the processing liquid and the nitrogen gas are successively supplied to the front surface Wf of the substrate W from a nozzle provided in an atmosphere blocking mechanism 5 in response to a supply command from the controller 4.

The atmosphere blocking mechanism 5 includes a blocking plate 51, an upper spin shaft 52 provided to be integrally rotatable with the blocking plate 51 and an upper nozzle 53 penetrating in a vertical direction through a central part of the blocking plate 51. The blocking plate 51 is finished into a disk shape having a diameter substantially equal to or larger than that of the substrate W. The blocking plate 51 is arranged to face the upper surface of the substrate W held by the spin chuck 3 while being spaced apart. Thus, the lower surface of the blocking plate 51 functions as a circular substrate facing surface 51a facing the entire front surface Wf of the substrate W. Further, a hollow cylindrical through hole 51b penetrating in the vertical direction through the blocking plate 51 is formed in a central part of the substrate facing surface 51a.

The upper spin shaft 52 is provided rotatably about an axis of rotation (axis coinciding with the axis of rotation C1 of the substrate W) vertically extending through a center of the blocking plate 51. The upper spin shaft 52 has a hollow cylindrical shape. The inner peripheral surface of the upper spin shaft 52 is formed into a cylindrical surface centered on the above axis of rotation. An internal space of the upper spin shaft 52 communicates with the through hole 51b of the blocking plate 51. The upper spin shaft 52 is supported relatively rotatably on a support arm 54 horizontally extending above the blocking plate 51.

The upper nozzle 53 is arranged above the spin chuck 3. The upper nozzle 53 is supported by the support arm 54 in a state unrotatable with respect to the support arm 54. Further, the upper nozzle 53 is movable upward and downward integrally with the blocking plate 51, the upper spin shaft 52 and the support arm 54. A discharge port 53a is provided in a lower end part of the upper nozzle 53 and facing a central part of the front surface Wf of the substrate W held by the spin chuck 3.

A blocking plate rotating/driving mechanism 55 (FIG. 4) including an electric motor and the like is coupled to the blocking plate 51. The blocking plate rotating/driving mechanism 55 rotates the blocking plate 51 and the upper spin shaft 52 about the axis of rotation C1 with respect to the support arm 54 in response to a rotation command from the controller 4. Further, a blocking plate elevating/driving mechanism 56 is coupled to the support arm 54. The blocking plate elevating/driving mechanism 56 integrally moves the blocking plate 51, the upper spin shaft 52 and the upper nozzle 53 upward and downward in a vertical direction Z in response to an elevation command from the controller 4. More specifically, the blocking plate elevating/driving mechanism 56 moves the blocking plate 51, the upper spin shaft 52 and the upper nozzle 53 upward and downward between a blocking position (the position shown in FIG. 3 and the upper-right stage of FIG. 5) where the substrate facing surface 51a is proximate to the front surface Wf of the substrate W held by the spin chuck 3 to substantially block a space above the front surface Wf from a surrounding atmosphere and a retracted position (not shown) retracted largely upward from the blocking position.

A chemical supply unit 61, a rinse liquid supply unit 62, an organic solvent supply unit 63, a processing liquid supply unit 64 and a front surface side gas supply unit 65A are connected to an upper end part of the upper nozzle 53.

The chemical supply unit 61 includes a chemical piping 611 connected to the upper nozzle 53 and a valve 612 disposed in the chemical piping 611. The chemical piping 611 is connected to a chemical supply source. In this embodiment, the chemical only has to have a function of cleaning the front surface Wf of the substrate W. For example, a chemical containing at least one of hydrofluoric acid (HF), hydrochloric acid, sulfuric acid, phosphoric acid and nitric acid can be, for example, used as an acidic chemical. Further, a chemical containing at least one of ammonia and a hydroxyl group can be, for example, used as an alkaline chemical. Note that, in this embodiment, hydrofluoric acid is used as the chemical. Thus, when the valve 612 is opened in response to an open/close command from the controller 4, a hydrofluoric acid chemical is supplied to the upper nozzle 53 and discharged toward a front surface central part of the substrate W from the discharge port 53a.

The rinse liquid supply unit 62 includes a rinse liquid piping 621 connected to the upper nozzle 53 and a valve 622 disposed in the rinse liquid piping 621. The rinse liquid piping 621 is connected to a rinse liquid supply source. In this embodiment, DIW is used as the rinse liquid. When the valve 622 is opened in response to an open/close command from the controller 4, the DIW is supplied to the upper nozzle 53 and discharged toward the front surface central part of the substrate W from the discharge port 53a. Note that, besides the DIW, any one of carbonated water, electrolytic ionized water, hydrogen water, ozone water and hydrochloric acid water having a diluted concentration (e.g. about 10 ppm to 100 ppm) may be used as the rinse liquid.

The organic solvent supply unit 63 is a unit for supplying an organic solvent having a larger specific weight than air, having a lower surface tension than water and serving as a low surface tension liquid. The organic solvent supply unit 63 includes an organic solvent piping 631 connected to the upper nozzle 53 and a valve 632 disposed in the organic solvent piping 631. The organic solvent piping 631 is connected to an organic solvent supply source. In this embodiment, IPA is used as the organic solvent. When the valve 632 is opened in response to an open/close command from the controller 4, the IPA is supplied to the upper nozzle 53 and discharged toward the front surface central part of the substrate W from the discharge port 53a. Note that, besides the IPA, methanol, ethanol, acetone, EG (ethylene glycol) and HFE (hydrofluoroether) can be, for example, used as the organic solvent. Further, the organic solvent may be not only composed of a single component, but also a liquid mixed with other component(s). For example, the organic solvent may be a mixed liquid of IPA and acetone or a mixed liquid of IPA and methanol.

The processing liquid supply unit 64 is a unit for supplying a processing liquid functioning as a drying auxiliary liquid in drying the substrate W held by the spin chuck 3 to the front surface Wf of the substrate W. The processing liquid supply unit 64 includes a processing liquid piping 641, a valve 642 disposed in the processing liquid piping 641, and a processing liquid supply part 643 functioning as a processing liquid supply source. The processing liquid piping 641 connects the upper nozzle 53 and the processing liquid supply part 643 to each other.

When a sublimation drying processing agent obtained by mixing a first sublimable substance and a second sublimable substance which are different from each other is replenished, the processing liquid supply part 643 heats the sublimation drying processing agent, to thereby liquefy the sublimation drying processing agent and prepare a processing liquid. Then, the processing liquid is stored into a not-shown storage tank. Further, the processing liquid supply part 643 has a pumping mechanism such as a pump or the like, to have a function for sending the processing liquid from the storage tank toward the upper nozzle 53 through the processing liquid piping 641. Therefore, when the valve 642 is opened in response to the command from the controller 4, the processing liquid flows in the processing liquid piping 641 and is pumped toward the upper nozzle 53. The processing liquid (the sublimation drying processing agent in a liquid form) is thereby supplied from the discharge port 53a of the upper nozzle 53 toward a central part of the front surface Wf of the substrate W. On the other hand, when the valve 642 is closed in response to the command from the controller 4, pumping of the processing liquid is stopped and the supply of the processing liquid from the upper nozzle 53 is also stopped.

In the present embodiment, camphor (having a melting point of 175° C.) is used as the first sublimable substance and cyclohexanone oxime (having a melting point of 90° C.) is used as the second sublimable substance, and the sublimation drying processing agent in a solid form in which the first sublimable substance and the second sublimable substance are mixed without using any solvent is replenished to the processing liquid supply part 643 as appropriate. As a matter of course, there may be a configuration where the sublimation drying processing agent in a liquid state is replenished to the processing liquid supply part 643 and stored into the storage tank. In other words, the sublimation drying processing agent to be replenished to the substrate processing apparatus 100 may be either a solid phase or a liquid phase.

Further, though the processing liquid supply part 643 is incorporated in the processing liquid supply unit 64 in the present embodiment, the processing liquid supply part 643 may be provided separately from the processing liquid supply unit 64. In other words, inside the substrate processing apparatus 100, there may be a configuration where a unit which corresponds to the processing liquid supply part 643 is separately provided outside the processing liquid supply unit 64 and the processing liquid (the sublimation drying processing agent in the liquid state) is supplied from the unit to the upper nozzle 53 through the processing liquid piping 641.

Note that, in this specification, "sublimability" means to have a property of phase transition of a single substance, a compound or a mixture from a solid state to a gaseous state or from a gaseous state to a solid state without passing through a liquid state and the "sublimable substance" means a substance having such sublimability. Further, a mixing ratio of the first sublimable substance and the second sublimable substance (a concentration (weight percentage) of cyclohexanone oxime in the present embodiment) and the respective types of the first sublimable substance and the second sublimable substance will be described later.

The front surface side gas supply unit 65A includes a gas supply piping 651 connected to the upper nozzle 53 and a valve 652 for opening and closing the gas supply piping 651. The gas supply piping 651 is connected to a gas supply source. In this embodiment, a dehumidified nitrogen gas is used as a gas. When the valve 652 is opened in response to an open/close command from the controller 4, the nitrogen gas is supplied to the upper nozzle 53 and blown toward the front surface central part of the substrate W from the discharge port 53a. Note that an inert gas such as a dehumidified argon gas may be used as the gas besides the nitrogen gas. The same applies to a back surface side gas supply unit 65B described next.

As shown in FIG. 3, the back surface side gas supply unit 65B has a gas supply piping 653 and a valve 654 for opening and closing the gas supply piping 653. One end of the gas supply piping 653 is connected to the gas supply source and the other end thereof is connected to a gas flow path 321. This gas flow path 321 has a cylindrical shape formed between an inner peripheral surface of a hole part extending vertically downward from a central opening 322 which is opened at an upper surface central part of the spin base 32 and an outer peripheral surface of a lower nozzle 71 inserted into the hole part. For this reason, like in the front surface side gas supply unit 65A, when the valve 654 is opened in response to the open/close command from the controller 4, the dehumidified nitrogen gas radially flows toward each direction between the back surface Wb of the substrate W and the upper surface of the spin base 32. A space between the substrate W and the spin base 32 is filled with the nitrogen gas.

Thus, to the lower nozzle 71 forming the gas flow path 321, connected is a coolant supply unit 66. The coolant supply unit 66 has a coolant piping 661 connected to the lower nozzle 71 and a valve 662 disposed in the coolant piping 661. The coolant piping 661 is connected to a coolant supply source. In the present embodiment, DIW cooled up to the temperature near 0° C. (hereinafter, referred to as "low-temperature DIW") is used as the coolant, and when the valve 662 is opened in response to the open/close command from the controller 4, the low-temperature DIW is supplied to the lower nozzle 71 and discharged toward a back surface central part of the substrate W. The substrate W is thereby cooled from the back surface Wb side, and solidification of the liquid film formed on the front surface Wf of the substrate W is efficiently promoted as described later. Further, there may be a configuration where a solvent such as a nitrogen gas having a temperature not higher than the freezing point, or the like, other than the low-temperature DIW is sent to the lower nozzle 71, to thereby cool the substrate W.

In the processing unit 1, an exhaust tub 80 is provided to surround the spin chuck 3. Further, a plurality of cups 81, 82 (first cup 81 and second cup 82) and a plurality of guards 84 to 86 (first to third guards 84 to 86) for receiving the processing liquid scattered around the substrate W are arranged between the spin chuck 3 and the exhaust tub 80. Further, guard elevating/driving mechanisms 87 to 89 (first to third guard elevating/driving mechanisms 87 to 89) are respectively coupled to the guards 84 to 86. The respective guard elevating/driving mechanisms 87 to 89 independently move the guards 84 to 86 upward and downward in response to an elevation command from the controller 4. Note that the guard elevating/driving mechanism 87 is not shown in FIG. 3.

The controller 4 includes an arithmetic unit such as a CPU, a storage unit such as a fixed memory device or a hard disk drive, and an input/output unit. A program to be executed by the arithmetic unit is stored in the storage unit. The controller 4 performs a substrate processing shown in FIG. 5 using the processing liquid described next by controlling each part of the apparatus in accordance with the above program. The details of the processing liquid and a substrate processing method are successively described in detail below.

<<Processing Liquid>>

Next, a processing liquid used in the present embodiment will be described below. The processing liquid of the present embodiment is a liquid in which a sublimation drying processing agent obtained by mixing camphor (the first sublimable substance) and cyclohexanone oxime (the second sublimable substance) in a eutectic composition or a near-eutectic composition is heated and thereby liquefied. The processing liquid of the present embodiment performs a function to assist a drying process for removing a liquid existing on a pattern formation surface of a substrate.

Though it is well known that camphor is a sublimable substance having a melting point of 175° C. and cyclohexanone oxime is a sublimable substance having a melting point of 90° C., there has been conventionally no sufficient knowledge about a mixture of both sublimable substances. Then, the inventor of the present application produces processing liquids by liquefying the mixtures (sublimation drying processing agents) of camphor and cyclohexanone oxime with respective compound ratios shown in Table 1, and then slowly cools the processing liquids. Then, with respect to each processing liquid, primary crystals α and β and a deposition temperature of a eutectic structure are obtained.

TABLE 1

| Camphor (g) | Cyclohexanone Oxime (g) | Concentration of Cyclohexanone Oxime (wt %) | Deposition Temperature (° C.) |
|---|---|---|---|
| 0.7 | 2.7 | 80 | 50 |
| 1.4 | 2.1 | 60 | 38 |
| 1.6 | 1.6 | 50 | 36 |
| 1.9 | 1.3 | 40 | 47.5 |
| 2.3 | 0.6 | 20 | 115 |
|  |  | 0 | 175 |

Figure 6:
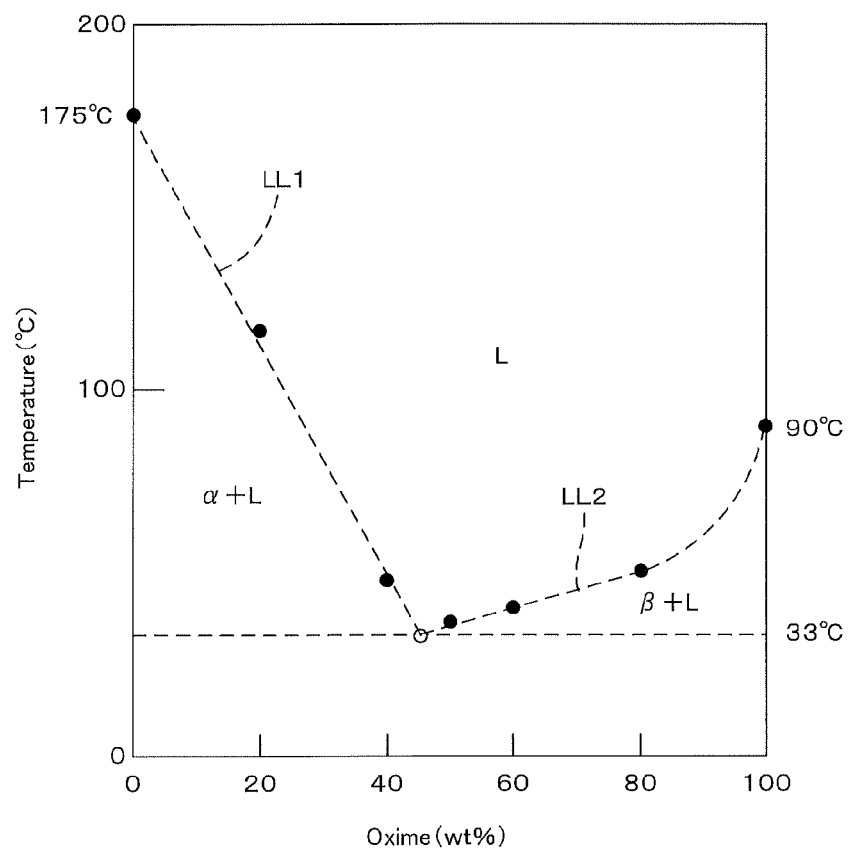
FIG. 6 is an estimated state diagram of an exemplary sublimation drying processing agent in accordance with the present invention.

Then, the inventor of the present application observes deposited structures. As a result, the sublimation drying processing agent shows a eutectic reaction and the phase diagram is estimated to be that shown in FIG. 6. FIG. 6 is an estimated state diagram of an exemplary sublimation drying processing agent in accordance with the present invention. The temperature and composition of a eutectic point derived from the phase diagram shown in this figure are estimated to be "33° C. (see the open circle in FIG. 6)" and "the concentration of cyclohexanone oxime in the sublimation drying processing agent: 45 wt %", respectively. Then, when the inventor of the present application prepares a sublimation drying processing agent obtained by mixing camphor and cyclohexanone oxime with a compound ratio of (55 wt %:45 wt %) and actually measures a temperature of the eutectic point (hereinafter, referred to as a "eutectic temperature"), the inventor obtains a eutectic temperature of "36° C.". Therefore, the inventor confirms that a composition (hereinafter, referred to as a "eutectic composition") at the eutectic point of the sublimation drying processing agent used in the present embodiment is as estimated above. Further, in the sublimation drying processing agent obtained by mixing in the eutectic composition or the near-eutectic composition, it is confirmed from the observation of the structure that a eutectic structure finer than the deposited structure of a single sublimable substance can be obtained. When the sublimation drying processing agent has such a fine eutectic structure, the stress occurring in the growth of the grain boundary can be suppressed. Therefore, as described later, by using the sublimation drying processing agent showing the eutectic reaction as a drying aid liquid, it can be expected that it is possible to ensure an improvement in the suppression of the collapse of the pattern. Moreover, the melting point of the sublimation drying processing agent is lower than that of the sublimation drying processing agent formed of a single sublimable substance, and it thereby becomes possible to ensure an increase in the workability and reduction in the energy cost for heating the sublimation drying processing agent. Further, due to the reduction in the melting point, it becomes possible to increase the thickness controllability of the liquid film.

As to the concentration of the cyclohexanone oxime, it is thought to be preferable to use the sublimation drying processing agent having a eutectic composition in terms of, for example, ensuring the fine structure and the reduction in the melting point. The same action effect can be produced also in the composition near the eutectic composition (hereinafter, referred to as a "near-eutectic composition"). In the sublimation drying processing agent obtained by mixing camphor and cyclohexanone oxime, for example, the concentration of cyclohexanone oxime is preferably not lower than 40 wt % and not higher than 60 wt %, and the concentration of cyclohexanone oxime is more preferably in the eutectic composition or on the hypereutectic side which is richer than the eutectic composition, i.e., not lower than 45 wt % and not higher than 60 wt %, and especially preferably not lower than 45 wt % and not higher than 55 wt %.

<<Substrate Processing Method>>

Figure 5:
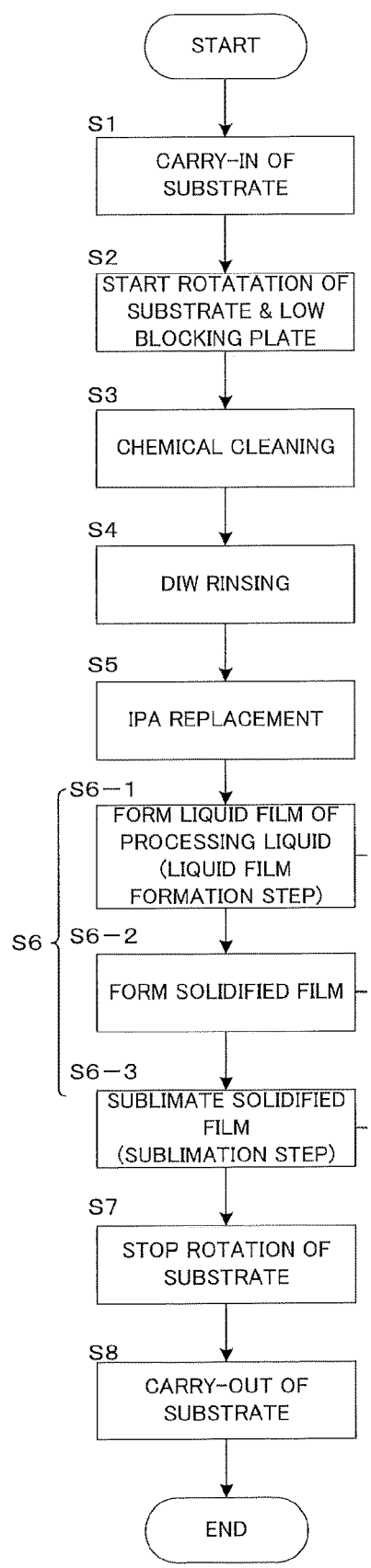
FIG. 5 is a view showing details of substrate processing performed in the substrate processing apparatus of FIG. 1.
Figure 5:
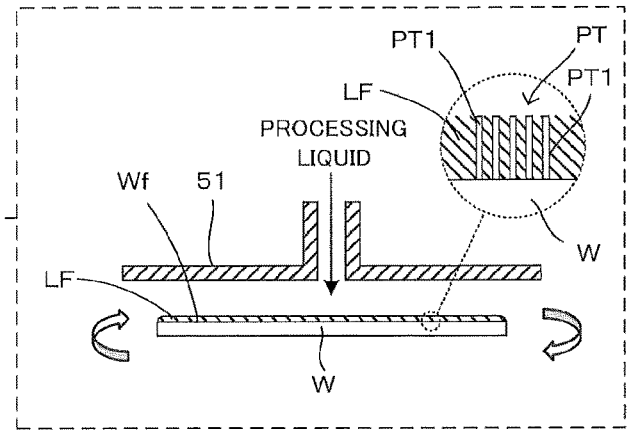
Figure 5:
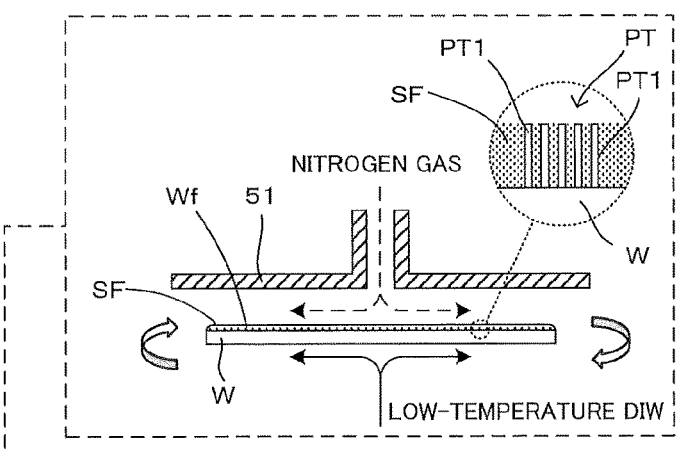
Figure 5:
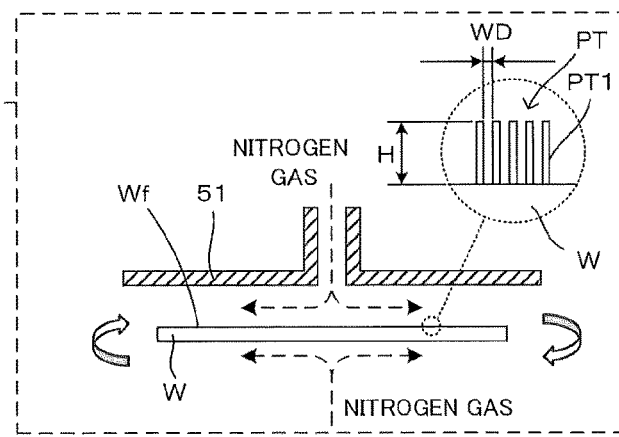

Next, the substrate processing method using the substrate processing apparatus 100 shown in FIG. 1 is described with reference to FIG. 5. FIG. 5 is a view showing details of substrate processing performed in the substrate processing apparatus of FIG. 1. In FIG. 5, a flowchart of the substrate processing performed in one processing unit 1 is shown on a left side. Further, a liquid film formation step, a solidified film formation step and a sublimation step are schematically shown and a part of the front surface Wf of the substrate W is enlargedly shown in upper-right, middle-right and lower-right stages. However, for the purpose of facilitating understanding, dimensions, numbers and the like of parts are shown in an exaggerated or simplified manner if necessary.

A processing target in the substrate processing apparatus 100 is, for example, a silicon wafer, and an uneven pattern PT is formed on a front surface Wf, which is a pattern formation surface. In this embodiment, projections PT1 have a height in a range of 100 to 600 nm and a width in a range of 5 to 50 nm. A shortest distance between two adjacent projections PT1 (shortest width of a recess) is in a range of 5 to 150 nm. An aspect ratio, i.e. a value obtained by dividing a height by a width (height H/width WD), of the projections PT1 is 5 to 35.

Further, the pattern PT may be such that linear pattern elements formed by fine trenches are repeatedly arranged. Further, the pattern PT may be formed by providing a plurality of fine holes (voids or pores) in a thin film. The pattern PT includes, for example, an insulation film. Further, the pattern PT may include a conductive film. More specifically, the pattern PT may be formed by a laminated film obtained by laminating a plurality of films and further include an insulation film and a conductive film. The pattern PT may be a pattern constituted by a single-layer film. The insulation film may be a silicon oxide film or a silicon nitride film. Further, the conductive film may be an amorphous silicon film having impurities introduced thereto to reduce resistance or may be a metal film (e.g. TiN film). Further, the pattern PT may be formed by a front-end process or may be formed by a back-end process. Furthermore, the pattern PT may be a hydrophobic film or may be a hydrophilic film. Examples of the hydrophilic film include a TEOS film (one type of a silicon oxide film).

Further, each step shown in FIG. 6 is processed in an atmospheric environment unless otherwise specified. Here, the atmospheric environment indicates an environment at 0.7 atmospheres to 1.3 atmospheres with respect to normal atmospheric pressure (1 atmosphere, 1013 hPa). Particularly, if the substrate processing apparatus 100 is arranged in a clean room at a positive pressure, an environment for the front surface Wf of the substrate W is higher than one atmosphere.

Before an unprocessed substrate W is carried into the processing unit 1, the controller 4 gives a command to each part of the apparatus and the processing unit 1 is set in an initial state. Specifically, the shutter 23 (FIGS. 1, 2) is closed by the shutter opening/closing mechanism 22. The spin chuck 3 is positioned and stopped at a position suitable for the loading of the substrate W by the substrate rotating/driving mechanism 34, and the chuck pins 31 are set in an open state by an unillustrated chuck opening/closing mechanism. The blocking plate 51 is positioned at the retracted position by the blocking plate elevating/driving mechanism 56, and the rotation of the blocking plate 51 by the blocking plate rotating/driving mechanism 55 is stopped. Any of the guards 84 to 86 is moved downward and positioned. Further, any of the valves 612, 622, 632, 642, 652, 654 and 662 is closed.

When the unprocessed substrate W is conveyed by the substrate conveyor robot 111, the shutter 23 is opened. As the shutter 23 is opened, the substrate W is carried into the internal space 21 of the chamber 2 by the substrate conveyor robot 111 and transferred to the spin chuck 3 with a front surface Wf faced up. Then, the chuck pins 31 are set in a closed state and the substrate W is held by the spin chuck 3 (Step S1: carry-in of the substrate).

Following the carry-in of the substrate W, the substrate conveyor robot 111 is retracted to the outside of the chamber 2. Further, after the shutter 23 is closed again, the controller 4 increases a rotation speed (number of rotations) of the spin chuck 3 to a predetermined processing speed (e.g. 800 to 1200 rpm within a range of about 10 to 3000 rpm) by controlling the motor of the substrate rotating/driving mechanism 34 and maintains that processing speed. Further, the controller 4 lowers the blocking plate 51 from the retracted position and arranges the blocking plate 51 at the blocking position by controlling the blocking plate elevating/driving mechanism 56 (Step S2). Further, the controller 4 causes the first guard 84 to face a peripheral end surface of the substrate W by controlling the guard elevating/driving mechanisms 87 to 89 and raising the first to third guards 84 to 86 to upper positions.

When the rotation of the substrate W reaches the processing speed, the controller 4 subsequently opens the valve 612. In this way, the chemical (HF in this embodiment) is discharged from the discharge port 53a of the upper nozzle 53 and supplied to the front surface Wf of the substrate W. On the front surface Wf of the substrate W, the HF moves to a peripheral edge part of the substrate W by receiving a centrifugal force caused by the rotation of the substrate W. In this way, the entire front surface Wf of the substrate W is cleaned by the HF (Step S3). At this time, the HF having reached the peripheral edge part of the substrate W is discharged laterally of the substrate W from the peripheral edge part of the substrate W, received by an inner wall of the first guard 84 and fed to a waste liquid processing facility outside the apparatus along an unillustrated waste liquid path. This chemical cleaning by the supply of the HF is continued for a cleaning time determined in advance. Upon the elapse of the cleaning time, the controller 4 closes the valve 612 and stops the discharge of the HF from the upper nozzle 53.

Following the chemical cleaning, the rinsing process by the rinse liquid (DIW) is performed (Step S4). In this DIW rinsing, the controller 4 opens the valve 622 while maintaining the positions of the first to third guards 84 to 86. In this way, the DIW is supplied as the rinse liquid from the discharge port 53a of the upper nozzle 53 to a central part of the front surface Wf of the substrate W subjected to the chemical cleaning process. Then, the DIW moves to the peripheral edge part of the substrate W by receiving the centrifugal force caused by the rotation of the substrate W. In this way, the HF adhering on the substrate W is washed away by the DIW. At this time, the DIW discharged from the peripheral edge part of the substrate W is discharged laterally of the substrate W from the peripheral edge part of the substrate W and fed to the waste liquid processing facility outside the apparatus similarly to the HF. This DIW rinsing is continued for a rinsing time determined in advance. Upon the elapse of the rinsing time, the controller 4 closes the valve 622 and stops the discharge of the DIW from the upper nozzle 53.

After the DIW rinsing is completed, a replacement process by an organic solvent (IPA in this embodiment) having a lower surface tension than the DIW is performed (Step S5). In IPA replacement, the controller 4 causes the third guard 86 to face the peripheral end surface of the substrate W by controlling the guard elevating/driving mechanisms 87, 88 and lowering the first and second guards 84, 85 to lower positions. Then, the controller 4 opens the valve 632. In that way, the IPA is discharged as a low surface tension liquid toward the central part of the front surface Wf of the substrate W having the DIW adhered thereto from the discharge port 53a of the upper nozzle 53. The IPA supplied to the front surface Wf of the substrate W spreads over the entire front surface Wf of the substrate W by receiving the centrifugal force caused by the rotation of the substrate W. In this way, the DIW (rinse liquid) adhering to the front surface Wf is replaced by the IPA in the entire front surface Wf of the substrate W. Note that the IPA moving on the front surface Wf of the substrate W is discharged laterally of the substrate W from the peripheral edge part of the substrate W, received by an inner wall of the third guard 86 and fed to a recovery facility along an unillustrated recovery path. This IPA replacement is continued for a replacement time determined in advance. Upon the elapse of the replacement time, the controller 4 closes the valve 632 and stops the discharge of the IPA from the upper nozzle 53.

Following the IPA replacement, a sublimation drying step (Step S6) corresponding to a first embodiment of the substrate processing method of the present invention is performed. This sublimation drying step includes a liquid film formation step of forming a liquid film of the processing liquid (Step S6-1), a solidified film formation step of forming a solidified film of the sublimation drying processing agent (=cyclohexanone oxime+camphor) by solidifying the liquid film of the processing liquid (Step S6-2) and a sublimation step of removing the solidified film from the front surface Wf of the substrate W by sublimating the solidified film (Step S6-3).

In Step S6-1, the controller 4 causes the second guard 85 to face the peripheral end surface of the substrate W by controlling the second guard elevating/driving mechanism 88 and raising the second guard 85 to the upper position. Then, the controller 4 opens the valve 642. In that way, as shown in the upper-right stage of FIG. 5, the processing liquid (cyclohexanone oxime solution) is discharged as the drying auxiliary liquid toward the central part of the front surface Wf of the substrate W having the IPA adhered thereto from the discharge port 53a of the upper nozzle 53 and supplied to the front surface Wf of the substrate W. The processing liquid on the front surface Wf of the substrate W spreads over the entire front surface Wf of the substrate W by receiving the centrifugal force caused by the rotation of the substrate W. In this way, the IPA adhering to the front surface Wf is replaced by the processing liquid in the entire front surface W of the substrate W and a liquid film LF of the processing liquid is formed on the front surface Wf as shown in the upper-right stage of FIG. 5. A thickness of the liquid film LF is larger than the height of the projections PT1 and the entire pattern PT is immersed in the liquid film LF. Further, it is desirable to adjust the thickness of the liquid film LF by appropriately changing the rotation speed of the substrate W within a range of 300 rpm to 3000 rpm according to a concentration of cyclohexanone oxime contained in the processing liquid and the height and aspect ratio of the projections PT1. For example, if it is desired to thicken the liquid film LF, the rotation speed may be set low. Conversely, if it is desired to thin the liquid film LF, the rotation speed may be set high. If the liquid film LF having a desired film thickness is formed in this way, the controller 4 closes the valve 642 and stops the discharge of the processing liquid from the upper nozzle 53.

In next Step S6-2, the controller 4 opens the valve 652. As shown in the middle-right stage of FIG. 5, the dehumidified nitrogen gas covered with the liquid film LF of the processing liquid is thereby discharged toward the front surface Wf of the rotating substrate W. Further, the controller 4 opens the valve 662. The low-temperature DIW is thereby supplied from the lower nozzle 71 to the back surface central part of the substrate W. Thus, the substrate W is cooled and the solidification of the liquid film LF formed on the front surface Wf of the substrate W is efficiently promoted. Further, in the present embodiment, used is the sublimation drying processing agent obtained by mixing in the eutectic composition or the near-eutectic composition. In the sublimation drying processing agent in the eutectic composition, for example, a fine eutectic structure is uniformly deposited over the entire liquid film LF. Furthermore, on the hypoeutectic side where the concentration of cyclohexanone oxime is lower than that in the eutectic composition, when the temperature decreases to a liquidus line LL1 (see FIG. 6), camphor is deposited on part of the liquid film LF as a primary crystal α and the processing liquid L and the primary crystal α mixedly exist. Then, as the temperature further decreases, when the deposit of camphor grows and is cooled to the eutectic temperature (33° C.), a fine eutectic structure is uniformly formed on the remaining part. On the other hand, on the hypereutectic side where the concentration of cyclohexanone oxime is higher than that in the eutectic composition, when the temperature decreases to a liquidus line LL2 (see FIG. 6), cyclohexanone oxime is deposited on part of the liquid film LF as a primary crystal β and the processing liquid L and the primary crystal β mixedly exist. Then, as the temperature further decreases, when the deposit of cyclohexanone oxime grows and is cooled to the eutectic temperature (33° C.), a fine eutectic structure is uniformly formed on the remaining part.

Further, in the present embodiment, by spraying the nitrogen gas concurrently with the rotation of the substrate W, promotion of the deposition of the solidified film SF is ensured. Herein, the timing when the valve 652 is opened, i.e., the timing of starting discharge of the nitrogen gas may be before or after the start of deposition of the primary crystal α or β and the eutectic structure. Further, though it is not indispensable to supply the nitrogen gas or the low-temperature DIW for forming the solidified film of the sublimation drying processing agent, it is preferable to supply only the nitrogen gas, only the low-temperature DIW, or both the nitrogen gas and the low-temperature DIW, in order to improve the throughput.

Subsequently, the controller 4 performs the sublimation step (S6-3). The controller 4 causes the third guard 85 to face the peripheral end surface of the substrate W by controlling the second guard elevating/driving mechanism 88 and lowering the second guard 85 to the lower position. Note that although the controller 4 keeps the rotation speed of the substrate W from the formation step of the solidified film SF (Step S6-2), the rotation speed may be accelerated to a higher speed. Further, the controller 4 rotates the blocking plate 51 in the same direction and at the same speed as the rotation of the substrate W by controlling the blocking plate rotating/driving mechanism 55. According to the rotation of the substrate W, a contact speed of the solidified film SF with a surrounding atmosphere increases. In this way, the sublimation of the solidified film SF can be promoted and the solidified film SF can be sublimated in a short time. However, the rotation of the blocking plate 51 is not essential, but arbitrary in the sublimation step.

Further, in the sublimation step S6-3, the controller 4 keeps the open state of the valve 652 from the formation of the solidified film SF and the dehumidified nitrogen gas is discharged toward the central part of the front surface Wf of the substrate W in a rotating state from the discharge port 53a of the upper nozzle 53 as shown in the lower-right stage of FIG. 6. In this way, the sublimation step can be performed while a blocking space sandwiched between the front surface Wf of the substrate W and the substrate facing surface 51a of the blocking plate 51 is held in a low humidity state. In this sublimation step S6-3, heat of sublimation is deprived of as the solidified film SF is sublimated, and the solidified film SF is maintained at a temperature equal to or lower than the eutectic temperature. Thus, the melting of the sublimable substance, i.e. eutectic structure, eutectic structure+camphor, eutectic structure+cyclohexanone oxime, constituting the solidified film SF can be effectively prevented. Since no liquid phase is present between the pattern elements of the pattern PT on the front surface Wf of the substrate W in this way, the substrate W can be dried while a problem of the collapse of the pattern PT is mitigated.

Furthermore, in the sublimation step S6-3, the controller 4 opens the valve 654 to supply the dehumidified nitrogen gas and fill the space between the back surface Wb of the substrate W and the spin base 32 with the nitrogen gas, to thereby promote drying of the back surface Wb of the substrate W while closing the valve 662 to stop the supply of the low-temperature DIW.

Upon the elapse of a sublimation time determined in advance after the start of the sublimation drying step S6, the controller 4 closes valves 652 and 654 to stop the supply of nitrogen gas and stops the rotation of the spin chuck 3 by controlling the motor of the substrate rotating/driving mechanism 34 in Step S7. Further, the controller 4 stops the rotation of the blocking plate 51 by controlling the blocking plate rotating/driving mechanism 55 and raises the blocking plate 51 from the blocking position to the retracted position and positions the blocking plate 51 by controlling the blocking plate elevating/driving mechanism 56. Furthermore, the controller 4 retracts all the guards 86 to 88 downward from the peripheral end surface of the substrate W by controlling the third guard elevating/driving mechanism 89 and lowering the third guard 86.

Thereafter, after the controller 4 opens the shutter 23 (FIGS. 1 and 2) by controlling the shutter opening/closing mechanism 22, the substrate conveyor robot 111 enters the internal space of the chamber 2 and carries out the processed substrate W released from the chuck pins 31 to the outside of the chamber 2 (Step S8). Note that if the carry-out of the substrate W is completed and the substrate conveyor robot 111 is separated from the processing unit 1, the controller 4 closes the shutter 23 by controlling the shutter opening/closing mechanism 22.

Thus, in the present embodiment, the IPA adhering to the front surface Wf of the substrate W is replaced by the above-described processing liquid (in which the sublimation drying processing agent obtained by mixing camphor and cyclohexanone oxime in the eutectic composition or the near-eutectic composition is liquefied), to thereby form the liquid film LF. Next, after the liquid film LF is cooled to a temperature lower than the eutectic temperature to thereby form the solidified film SF containing the eutectic structure, the solidified film SF is sublimated. In other words, the solidified film SF is removed from the front surface Wf of the substrate W without passing through the liquid state. Therefore, by using the substrate processing method in accordance with the present embodiment, it is possible to dry the substrate W while preventing the collapse of the pattern PT.

Further, in the above-described embodiment, since the sublimation drying processing agent is obtained by mixing camphor (the first sublimable substance) and cyclohexanone oxime (the second sublimable substance) in the eutectic composition or the near-eutectic composition as described above, the following action effect can be produced. As described earlier, in the background art using the sublimation drying processing agent in which the sublimable substance is dissolved in the solvent, the solvent sometimes remains in the solidified film SF. In contrast to this, in the sublimation drying processing agent used in the present embodiment, since no solvent exists, remaining of the solvent in the solidified film SF does not occur. As a result, it is possible to further satisfactorily suppress the collapse of the pattern PT on the front surface Wf of the substrate W.

Furthermore, one measure to prevent the remaining of the solvent from occurring is to compose the sublimation drying processing agent of a single sublimable substance. After the liquid film LF is formed of the processing liquid in which the sublimation drying processing agent is liquefied, on the front surface Wf of the substrate W, however, when the liquid film LF is cooled, the primary crystals of the sublimable substance are dispersed in the liquid film LF and deposited, and individually grow as the temperature further decreases. For this reason, the grain boundary in the solidified film SF unevenly grows. As a result, the stress occurring in the growth of the grain boundary becomes relatively large. In contrast to this, according to the present embodiment, in the solidification of the liquid film LF, a eutectic structure of camphor and cyclohexanone oxime is formed. Since this eutectic structure is finer than the deposited structure of a single sublimable substance, the stress occurring in the growth of the grain boundary is suppressed. As a result, it is possible to effectively suppress the collapse of the pattern PT. Moreover, the eutectic temperature of the sublimation drying processing agent becomes lower than the melting point of the sublimation drying processing agent formed of a single sublimable substance, and it is thereby possible to ensure an increase in the workability and reduction in the energy cost for liquefying (heating) the sublimation drying processing agent. Further, due to the reduction in the melting point, the thickness controllability of the liquid film LF is increased, and the solidified film SF having a thickness corresponding to the height H (see the lower-right stage of FIG. 5) of the pattern PT is formed and it is thereby possible to further increase the suppression of the collapse of the pattern PT.

As described above, Step S6-1 corresponds to one example of a "liquid film formation step" of the present invention, Step S6-2 corresponds to one example of a "solidified film formation step" of the present invention, and Step S6-3 corresponds to one example of a "sublimation step" of the present invention.

Note that the present invention is not limited to the above embodiments and various changes other than the aforementioned ones can be made without departing from the gist of the present invention. Though the sublimation step (Step S6-3) is performed after the solidified film formation step (Step S6-2) is completed in the above-described embodiment, for example, the solidified film formation step and the sublimation step may partially overlap each other. In the solidified film formation step (Step S6-2), for example, by rotating the substrate W at a low speed (e.g., 100 rpm), a filling process (dwell) for filling the pattern PT with the sublimable substance may be performed concurrently with the deposition process of the eutectic structure. In this case, the sublimation step may be started before the sublimable substance filling the pattern PT is completely solidified. In other words, the solid of the sublimable substance may be sublimated while being maintained in a pre-crystal transition state before being crystallized. The solid of the sublimable substance is thereby removed from the front surface of the substrate W without passing through a crystallized state. Therefore, it is possible to reduce the effect of the stress due to the crystallization of the solid of the sublimable substance and further effectively reduce the collapse of the pattern PT on the substrate W.

Further, though camphor and cyclohexanone oxime are used as the first sublimable substance and the second sublimable substance, respectively, in the above-described embodiment, the combination of the first sublimable substance and the second sublimable substance is not limited to this exemplary case. There may be a case, for example, where the first sublimable substance is a sublimable substance having a first melting point higher than the substrate processing temperature (at least one kind selected from a group consisting of camphor, cyclohexanone oxime, and acetone oxime (having a melting point ranging from 58° C. to 63° C.)) while the second sublimable substance is a sublimable substance having a second melting point higher than the substrate processing temperature (at least one kind selected from a group consisting of camphor, cyclohexanone oxime, and acetone oxime except the above-described first sublimable substance). Further, there may be another case where the first sublimable substance is a sublimable substance having a first melting point higher than the substrate processing temperature (at least one kind selected from a group consisting of camphor, cyclohexanone oxime, and acetone oxime) while the second sublimable substance is a sublimable substance having a second melting point not higher than the substrate processing temperature (at least one kind selected from a group consisting of cyclohexanol (having a melting point ranging from 23° C. to 25° C.) or tert-butyl alcohol (having a melting point of 25° C.)).

EXAMPLES

A preferred mode of the present invention is specifically described with reference to Examples below. However, the present invention is, of course, not limited by the following Examples. Thus, it is, of course, possible to carry out the mode by adding appropriate changes within a range suitable for the gist described above and below and those are all included in the technical scope of the present invention.

Herein, by using the processing liquids in which the sublimation drying processing agents obtained by mixing camphor (the first sublimable substance) and cyclohexanone oxime (the second sublimable substance) with the following ratios are heated to be liquefied, the substrate processing is performed, following the procedure shown in FIG. 5. Further, the substrate processing conditions are the same except the sublimation drying processing agents.

Sublimation drying processing agent $A$=Camphor 60 wt %+Cyclohexanone oxime 40 wt %

Sublimation drying processing agent $B$=Camphor 55 wt %+Cyclohexanone oxime 45 wt %

Sublimation drying processing agent $C$=Camphor 50 wt %+Cyclohexanone oxime 50 wt %

Sublimation drying processing agent $D$=Camphor 40 wt %+Cyclohexanone oxime 60 wt %

Sublimation drying processing agent $E$=Camphor 0 wt %+Cyclohexanone oxime 100 wt %

Then, verification is performed on a collapse rate of the pattern on the substrate W after the sublimation drying. The result is as shown in FIG. 7. As is clear from this figure, by using any one of sublimation drying processing agents A to D each having the eutectic composition or the near-eutectic composition, the collapse rate of the pattern PT can be reduced, as compared with the case where a sublimation drying processing agent E formed of only a single sublimable substance is used. In other words, it is preferable that the concentration of cyclohexanone oxime should be not lower than 40 wt % and not higher than 60 wt %, and it is more preferable that cyclohexanone oxime should be in the eutectic composition or on the hypereutectic side where the concentration is higher than that of the eutectic composition, i.e., the concentration of cyclohexanone oxime should be not lower than 45 wt % and not higher than 60 wt % and especially preferable that the concentration thereof should be not lower than 45 wt % and not higher than 55 wt %.

Although the present invention has been described by way of the specific embodiments above, this description is not intended to be interpreted in a limited sense. By referring to the description of the present invention, various modifications of the disclosed embodiments will become apparent to a person skilled in this art similarly to other embodiments of the present invention. Hence, appended claims are thought to include these modifications and embodiments without departing from the true scope of the present invention.

INDUSTRIAL APPLICABILITY

The present invention can be applied to substrate processing techniques in general for drying a substrate having a front surface on which a pattern is formed, by using a sublimable substance in which phase transition occurs from a solid state to a gaseous state without passing through a liquid state.

REFERENCE SIGNS LIST

L processing liquid
LF liquid film
PT pattern
SF solidified film
W substrate
Wb back surface (of substrate)
Wf front surface (of substrate)

The invention claimed is:

1. A substrate processing method, comprising:

supplying a processing liquid in which a sublimation drying processing agent is liquefied, onto a front surface of a substrate on which a pattern is formed, to thereby form a liquid film of the processing liquid on the front surface of the substrate, the sublimation drying processing agent being a mixture of a first sublimable substance and a second sublimable substance which differ from each other in a eutectic composition or a near-eutectic composition;

solidifying the liquid film of the processing liquid, to thereby form a solidified film of the sublimation drying processing agent; and sublimating the solidified film, to thereby remove the solidified film from the front surface of the substrate, wherein the first sublimable substance is camphor, the second sublimable substance is cyclohexanone oxime, and the weight percentage of the second sublimable substance in the sublimation drying processing agent is in a range of from equal to or greater than the weight percentage at the eutectic composition and 60% or less.

2. The substrate processing method according to claim 1, wherein when performing formation of the liquid film, formation of the solidified film and sublimation of the solidified film, the substrate is processed at a normal temperature.

* * * * *